United States Patent
Yajima

(10) Patent No.: US 7,642,871 B2
(45) Date of Patent: Jan. 5, 2010

(54) SURFACE ACOUSTIC WAVE OSCILLATOR AND METHOD OF VARYING FREQUENCY THEREOF

(75) Inventor: Aritsugu Yajima, Matsumoto (JP)

(73) Assignee: Seiko Epson Corporation (JP)

( * ) Notice: Subject to any disclaimer, the term of this patent is extended or adjusted under 35 U.S.C. 154(b) by 145 days.

(21) Appl. No.: 11/847,632

(22) Filed: Aug. 30, 2007

(65) Prior Publication Data

US 2008/0068105 A1    Mar. 20, 2008

(30) Foreign Application Priority Data

Sep. 14, 2006  (JP) .............................. 2006-249405
Feb. 5, 2007   (JP) .............................. 2007-025144
Mar. 26, 2007  (JP) .............................. 2007-078414

(51) Int. Cl.
*H03B 5/12* (2006.01)

(52) U.S. Cl. .............................. 331/107 A; 331/116 M; 331/154

(58) Field of Classification Search ................. 331/154, 331/116 M, 107 A
See application file for complete search history.

(56) References Cited

U.S. PATENT DOCUMENTS 5,010,269 A    4/1991  Hikita et al.
5,043,681 A    8/1991  Tanemura et al.
6,380,816 B1   4/2002  Okaguchi

FOREIGN PATENT DOCUMENTS

| EP | 0 335 493    | 10/1989 |
|----|--------------|---------|
| JP | 03-129908    | 6/1991  |
| JP | 08-213838    | 8/1996  |
| JP | 2000-236218  | 8/2000  |
| JP | 2004-023568  | 1/2004  |
| JP | 2005-094585  | 4/2005  |

*Primary Examiner*—Arnold Kinkead
(74) *Attorney, Agent, or Firm*—Harness, Dickey & Pierce, P.L.C.

(57) ABSTRACT

A surface acoustic wave oscillator includes: a cross-coupled circuit including first and second active elements differentially connected to first and second output terminals; first and second surface acoustic wave elements having different resonance frequencies and connected to the cross-coupled circuit in parallel; a first variable capacitance circuit including a first variable capacitance element and changing the resonance frequency of the first surface acoustic wave element; and a second variable capacitance circuit including a second variable capacitance element and changing the resonance frequency of the second surface acoustic wave element, wherein the first surface acoustic wave element is connected to the first variable capacitance circuit, the second surface acoustic wave element is connected to the second variable capacitance circuit, and oscillating outputs from combining outputs of the first and second surface acoustic wave elements are outputted by the cross-coupled circuit.

3 Claims, 11 Drawing Sheets

SURFACE ACOUSTIC WAVE OSCILLATOR AND METHOD OF VARYING FREQUENCY THEREOF

RELATED APPLICATIONS

This application claims priority to Japanese Patent Application Nos. 2006-249405 filed Sep. 14, 2006, 2007-078414 filed Mar. 26, 2007, and 2007-025144 filed Feb. 5, 2007 which are hereby expressly incorporated by reference herein in their entirety.

BACKGROUND

1. Technical Field

The present invention relates to a surface acoustic wave oscillator including surface acoustic wave elements having different resonance frequencies and a cross-coupled circuit that differentially connects those elements and to a method of varying the frequency thereof.

2. Related Art

In mobile communication devices communication is performed by, for example, switching multiple channels within the range of the allocated frequency bandwidth. Therefore, it is necessary to perform switching to the designated channel (frequency) at a control channel. Therefore, a synthesizer including a Phase Locked Loop (PLL) circuit has been used. As this PLL circuit, a voltage controlled oscillator (VCO) has been widely used, in which the oscillating frequency is switched by applying a control voltage. As a conventional example of the VCO in which the oscillating frequency is switched by applying a control voltage, a known method changes the electrostatic capacitance by applying a control voltage to a variable capacitance diode, thereby shifting a resonance point of the surface acoustic wave (SAW) elements.

However, when switching channels within the used frequency bandwidth, a high SN ratio (ratio of signal power and noise power) and a high CN ratio (ratio of carrier power and noise power) are demanded for the entire range of this frequency bandwidth. However, with a conventional VCO, it is rather difficult to keep the SN ratio and the CN ratio high with respect to all of the frequency bandwidth, and when the amount of frequency change becomes large, the SN ratio and the CN ratio becomes disadvantageously lower. On the other hand, when an attempt is made to keep the SN ratio and the CN ratio high, the variable range of the frequency becomes disadvantageously narrower. To solve these problems, there is a method of allocating each half of the frequency bandwidth by using two VCOs. However, the use of two VCOs contradicts the miniaturization of communication devices and therefore cannot be considered as a practicable solution.

SUMMARY

An aspect of the present invention is to achieve a broader bandwidth of a surface acoustic wave oscillator while ensuring the continuousness of the oscillating frequency and to provide a method of changing the frequency without any complicated control.

A surface acoustic wave oscillator according to one aspect of the invention includes: a cross-coupled circuit including a first active element and a second active element differentially connected to a first output terminal and a second output terminal; a first surface acoustic wave element and a second surface acoustic wave element having different resonance frequencies and connected to the cross-coupled circuit in parallel; a first variable capacitance circuit including a first variable capacitance element and changing the resonance frequency of the first surface acoustic wave element, the first variable capacitance element changing capacitance value in accordance with a first control voltage applied from a first control terminal; and a second variable capacitance circuit including a second variable capacitance element and changing the resonance frequency of the second surface acoustic wave element, the second variable capacitance element changing capacitance value in accordance with a second control voltage applied from a second control terminal, wherein: the first surface acoustic wave element and the first variable capacitance circuit are connected and the second surface acoustic wave element and the second variable capacitance circuit are connected; and oscillating outputs obtained by combining the outputs of the first surface acoustic wave element and the second surface acoustic wave element are outputted by the cross-coupled circuit.

According to this aspect of the invention, the first control voltage and second control voltage are applied to the first surface acoustic wave element and the second surface acoustic wave element having different resonance frequencies and connected to the cross-coupled circuit in parallel via the first variable capacitance element and the second variable capacitance element, thereby oscillating the first surface acoustic wave element and the second surface acoustic wave element. The oscillating output obtained by combining the outputs of the first surface acoustic wave element and the second surface acoustic wave element is outputted at the cross-coupled circuit, so the respective oscillating frequencies can be continuously switched to be outputted. This makes it possible to output continuously oscillating frequencies having a broader bandwidth.

The first surface acoustic wave element and the second surface acoustic wave element may be stacked on a semiconductor chip including the cross-coupled circuit, the first variable capacitance circuit and the second variable capacitance circuit.

According to this construction, two surface acoustic wave elements stacked on the substrate of the semiconductor chip (integrated circuit) are arranged in parallel, so an area having the size of only two surface acoustic wave elements is required, thereby making it possible to suppress an increase in area and to achieve miniaturization.

A method of varying a frequency for a surface acoustic wave oscillator according to a second aspect of the invention includes, the surface acoustic wave oscillator which has: a cross-coupled circuit including a first active element and a second active element differentially connected to a first output terminal and a second output terminal; a first surface acoustic wave element and a second surface acoustic wave element having different resonance frequencies and connected to the cross-coupled circuit in parallel; a first variable capacitance circuit including a first variable capacitance element and changing the resonance frequency of the first surface acoustic wave element, the first variable capacitance element changing capacitance value in accordance with a first control voltage applied from a first control terminal; and a second variable capacitance circuit including a second variable capacitance element and changing the resonance frequency of the second surface acoustic wave element, the second variable capacitance element changing capacitance value in accordance with a second control voltage applied from a second control terminal, wherein: the first surface acoustic wave element and the first variable capacitance circuit are connected and the second surface acoustic wave element and the second variable capacitance circuit are connected; and oscillating outputs obtained by combining the outputs of the first surface acoustic wave element and the second surface acoustic wave element are outputted by the cross-coupled circuit, the method includes changing the oscillating frequencies of the first surface acoustic wave element and the second surface acoustic wave element by changing the voltage values of the first control voltage and the second control voltage.

According to this aspect, by changing the first control voltage applied to the first control terminal, the capacitance value (capacitor capacitance) of the first variable capacitance element is changed and the resonance frequency of the first surface acoustic wave element is substantially continuously changed in accordance with this capacitance value. Further, by changing the second control voltage applied to the second control terminal, the capacitance value (capacitor capacitance) of the second variable capacitance element is changed and the resonance frequency of the second surface acoustic wave element is substantially continuously changed in accordance with this capacitance value.

Since the first surface acoustic wave element and the second surface acoustic wave element are connected in parallel to the cross-coupled circuit and have different resonance frequencies, it is possible to achieve a broader bandwidth of the oscillating frequencies of the first surface acoustic wave element and the second surface acoustic wave element and to make the oscillating frequencies to continuously change.

BRIEF DESCRIPTION OF THE DRAWINGS

Aspects of the invention will be described with reference to the accompanying drawings, wherein like numbers reference like elements.

DESCRIPTION OF EXEMPLARY EMBODIMENTS

Hereinafter, embodiments of the present invention will be described with reference to drawings.

FIG. 1 through FIG. 4 show the configuration and the operation of a surface acoustic wave oscillator, and a frequency variable method according to an embodiment of the invention. FIG. 5 through FIG. 8 show the configuration of a surface acoustic wave oscillator according to a modification of this embodiment.

Embodiment

Figure 1:
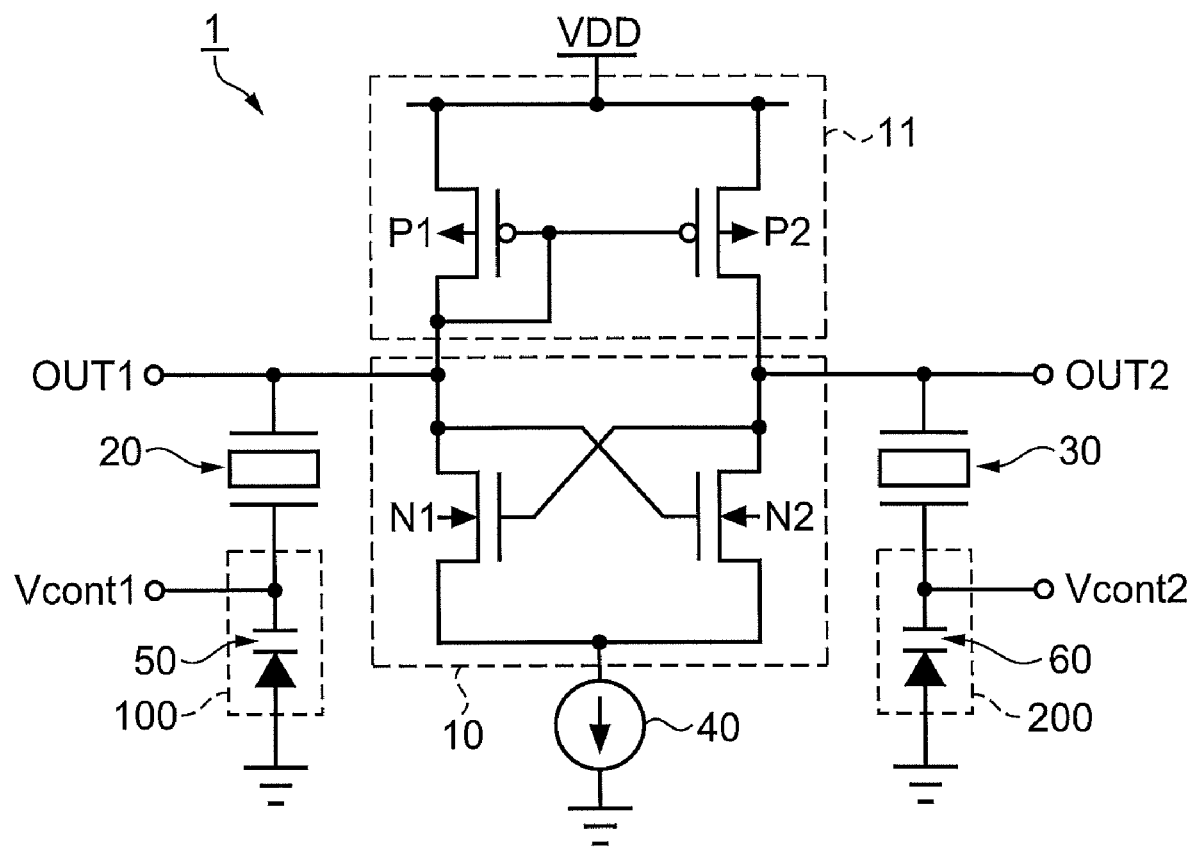
FIG. 1 is a circuit diagram showing the configuration of a surface acoustic wave oscillator according to an embodiment of the invention.

First, the configuration of the surface acoustic wave oscillator according to this embodiment of the invention will be described with reference to the drawings. FIG. 1 is a circuit diagram illustrating the configuration of the surface acoustic wave oscillator according to this embodiment of the invention.

As shown in FIG. 1, the surface acoustic wave oscillator 1 includes a cross-coupled circuit 10 and a current mirror circuit 11 each connected to an output terminal OUT1 as a first output terminal and to an output terminal OUT2 as a second output terminal, a first variable capacitance circuit 100 connected to a SAW resonator 20 as a first surface acoustic wave element, to a SAW resonator 30 as a second surface acoustic wave element, and to a control terminal Vcont1 as a first control terminal, and a second variable capacitance circuit 200 connected to a control terminal Vcont2 as a second control terminal.

The cross-coupled circuit 10 is made up of a Nch transistor N1 (hereinafter merely referred to as transistor N1) and a Nch transistor N2 (hereinafter merely referred to as transistor N2) each being a pair of active elements (e.g., a first active element and a second active element) differentially connected to the output terminal OUT1 and the output terminal OUT2, respectively. Further, the cross-coupled circuit 10 is connected to the current mirror circuit 11 including Pch transistors P1 and P2 (hereinafter merely referred to as transistors P1, P2) and to a constant current source 40.

In the transistor P1, a source terminal is connected to a power line VDD (hereinafter merely referred to as VDD), and a gate terminal and a drain terminal are connected to the output terminal OUT1. In the transistor P2, a source terminal is connected to VDD, a gate terminal is connected to the output terminal OUT1, and a drain terminal is connected to the output terminal OUT2. Further, in the transistor N1, a source terminal is connected to a ground potential line via the constant current source 40, a gate terminal is connected to the output terminal OUT2, and a drain terminal is connected to the output terminal OUT1. In the transistor N2, a source terminal is connected to the ground potential line via the constant current source 40, a gate terminal is connected to the output terminal OUT1, and a drain terminal is connected to the output terminal OUT2.

The variable capacitance circuit 100 has a variable capacitance diode 50 as a first variable capacitance element. In the variable capacitance diode 50, a cathode terminal is connected to the control terminal Vcont1 and an anode terminal is connected to the ground potential line.

The variable capacitance circuit 200 has a variable capacitance diode 60 as a second variable capacitance element. In the variable capacitance diode 60, a cathode terminal is connected to the control terminal Vcont2 and an anode terminal is connected to the ground potential line.

In the SAW resonator 20, a piezoelectric film and an excitation electrode are stacked on a substrate of a semiconductor chip, and one terminal is connected to the output terminal OUT1 and the other terminal is connected to the cathode terminal of the variable capacitance diode 50 of the variable capacitance circuit 100. In other words, the SAW resonator 20 and the variable capacitance diode 50 are connected in series between the ground potential line and the output terminal OUT1 (from cross-coupled circuit 10).

In the SAW resonator 30, a piezoelectric film and an excitation electrode are stacked on a substrate of a semiconductor chip, and one terminal is connected to the output terminal OUT2 and the other terminal is connected to the cathode terminal of the variable capacitance diode 60 of the variable capacitance circuit 200. In other words, the SAW resonator 30 and the variable capacitance diode 60 are connected in series between the ground potential line and the output terminal OUT2 (from cross-coupled circuit 10).

Note that the resonance frequencies of the SAW resonator 20 and the SAW resonator 30 are made to be slightly different from each other.

As shown in FIG. 1, between the output terminal OUT1 and the output terminal OUT2 of the cross-coupled circuit 10 in the surface acoustic wave oscillator 1, the SAW resonator 20 and the variable capacitance circuit 100 are connected to the ground potential line, and the variable capacitance circuit 200 and the SAW resonator 30 are connected to the ground potential line. Therefore, with respect to the cross-coupled circuit 10, the SAW resonator 20 and the variable capacitance circuit 100, and the SAW resonator 30 and the variable capacitance circuit 200 are respectively connected in parallel.

Next, the operation of the surface acoustic wave oscillator will be described with reference to the drawings.

Figure 2:
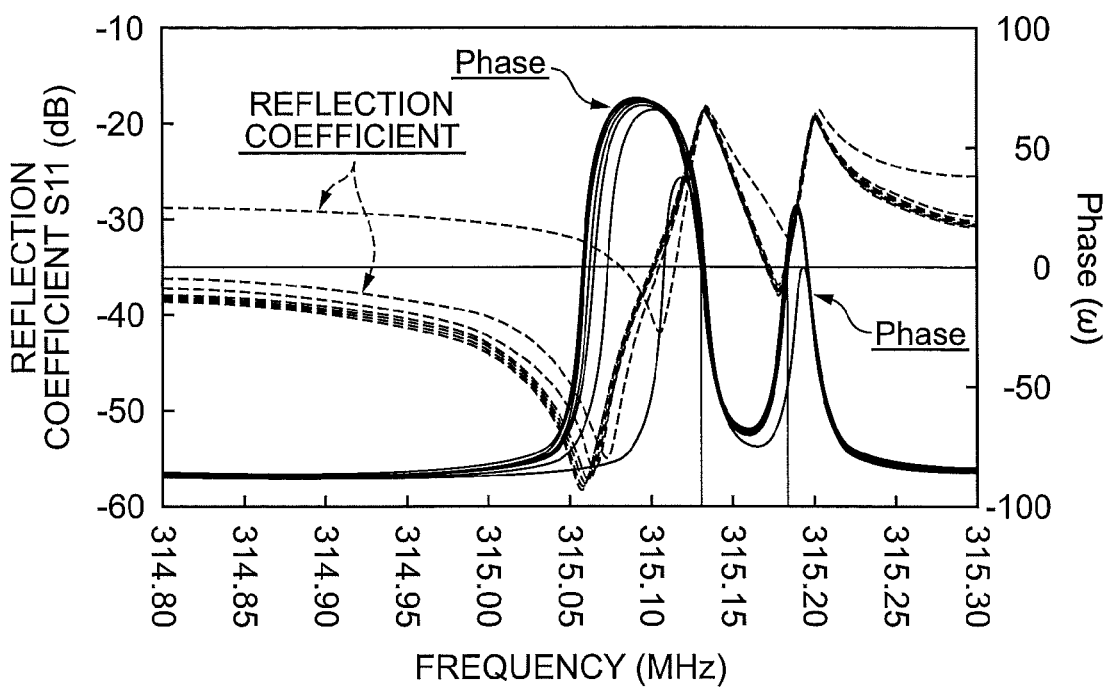
FIG. 2 is a graph illustrating the operation of the surface acoustic wave oscillator according to the embodiment of the invention.
Figure 3:
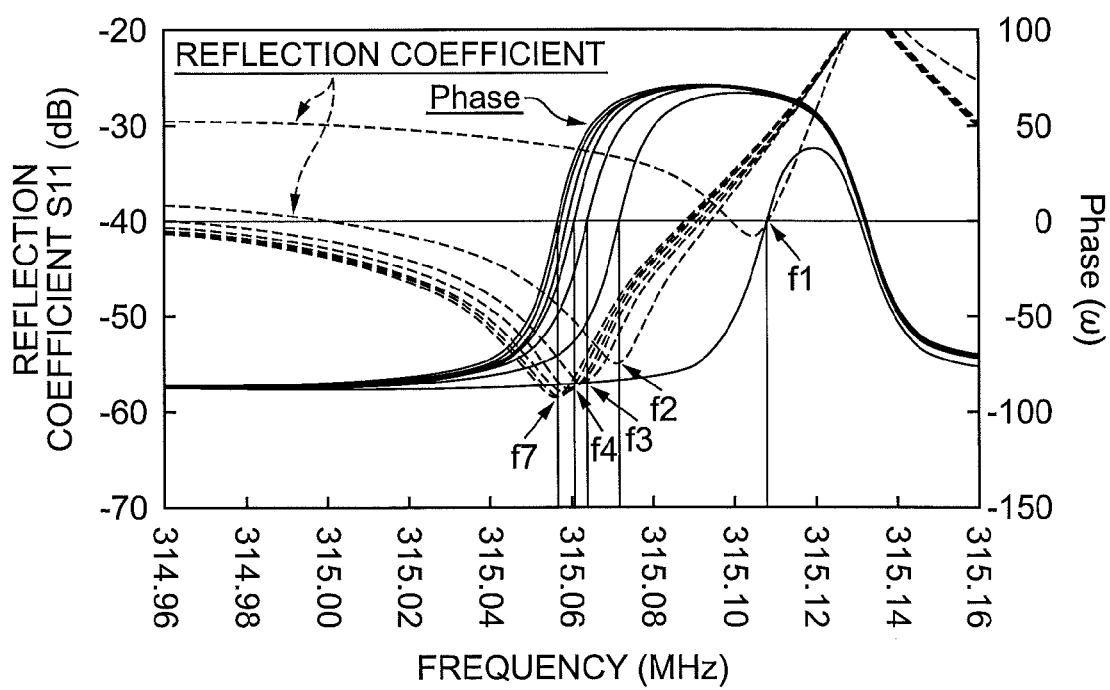
FIG. 3 is an enlarged view showing the horizontal axis of FIG. 2.

FIG. 2 and FIG. 3 are graphs illustrating the operation of the surface acoustic wave oscillator. The graph of FIG. 2 illustrates a case in which the same voltage is applied to the first control terminal and the second control terminal of the surface acoustic wave oscillator (that is to say, the first control voltage is equal to the second control voltage) while being changed. FIG. 3 is an enlarged view of the horizontal axis of FIG. 2.

The horizontal axis represents frequency (MHz), the left vertical axis represents reflection coefficient (S11: dB) and the right vertical axis represents phase characteristics (phase: ω). A plurality of graphs of the reflection coefficient S11 and the phase characteristics (Phase) shown respectively illustrate the case in which the first control voltage is changed and the case in which the second control voltage is changed. The output frequency corresponds to the intersection point of the lowest point of the reflection coefficient S11 at the time when the phase characteristic ω is zero. As shown in FIG. 2 and FIG. 3, the graph of the reflection coefficient S11 is lowered in the range between 315.0 MHz and 315.1 MHz, which means that frequency in this range can be made to be continuously variable.

Figure 4:
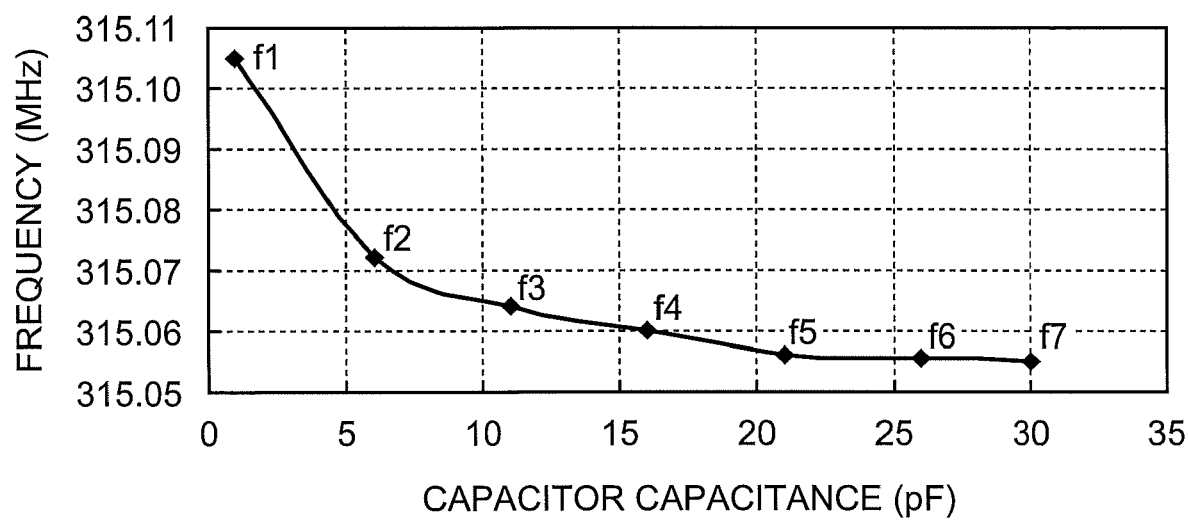
FIG. 4 is a graph showing the relationship between the capacitor capacitance and the frequency according to the embodiment of the invention.

FIG. 4 shows the relationship between the capacitance (capacitor capacitance) of the variable capacitance diodes 50, 60 of the surface acoustic wave oscillator according to this embodiment and frequency. In other words, FIG. 4 shows the plot of the frequency change shown in FIG. 2 and FIG. 3. As shown in FIG. 4, it is understood that in this surface acoustic wave oscillator the frequency can be continuously variable in the range between about 315.05 MHz to 315.10 MHz.

As shown in FIG. 4, frequency changes in accordance with the capacitor capacitance. To be more specific, in the vicinity of 1 pF, the frequency f1=315.105 MHz is outputted and in the vicinity of 30 pF, the frequency f7=315.055 MHz is outputted. The frequency changes therebetween while showing a nonlinear continuousness. Therefore, by changing the first control voltage and the second control voltage respectively, it becomes possible to change the capacitor capacitance of the variable capacitance diodes 50, 60 to be adjusted to the desired output frequencies of the SAW resonators 20, 30, respectively. It should be noted that the frequencies f1 to f7 shown in FIG. 4 correspond to the frequencies f1 to f7 shown in FIG. 3, respectively.

While the above described embodiment concerned a case in which the same voltage is applied to the control terminal Vcont1 and the control terminal Vcont2, it is also possible to control those control terminals by respectively using different voltages, thereby making it possible to set more differentiated frequencies and to achieve wider bandwidth.

Therefore, according to this embodiment, the first control voltage and the second control voltage are respectively applied to the SAW resonators 20, 30 having different frequencies and connected to the cross-coupled circuit 10 in parallel respectively via the variable capacitance diodes 50, 60. By changing the applied voltages of the first control voltage and the second control voltage, the capacitor capacitance of the variable capacitance diodes 50, 60 is changed and the SAW resonators 20, 30 are oscillated by using desired oscillating frequencies. At this time, the oscillating output obtained by combining the outputs of the SAW resonator 20 and the SAW resonator 30 at the cross-coupled circuit 10 is outputted, so the respective oscillating frequencies can be continuously switched to be outputted. This makes it possible to achieve a broader bandwidth and to continuously change the oscillating frequency.

Further, the SAW resonators 20, 30 are constructed such that they are stacked on the substrate of the semiconductor chip including the cross-coupled circuit 10, the first variable capacitance circuit 100 and the second variable capacitance circuit 200. With such a structure, it becomes possible to make the area of the surface acoustic wave oscillator 1 be only as large as two pieces of the surface acoustic wave elements (SAW resonators 20, 30), thereby making it possible to suppress an increase in required area and to achieve miniaturization.

It should be noted that the above described embodiment should not be construed restrictively and the invention is not limited to the above-described embodiment at all and the invention may be embodied in various modes without departing from the gist thereof. Hereinafter, exemplary modifications of circuit configurations will be described. Note that FIG. 1, and FIG. 5 through FIG. 9 relate to the case in which the variable capacitance diode is of an NMOS type and FIG. 10 thorough FIG. 14 relate to the case in which the variable capacitance diode is of a PMOS type.

First Modification

Figure 5:
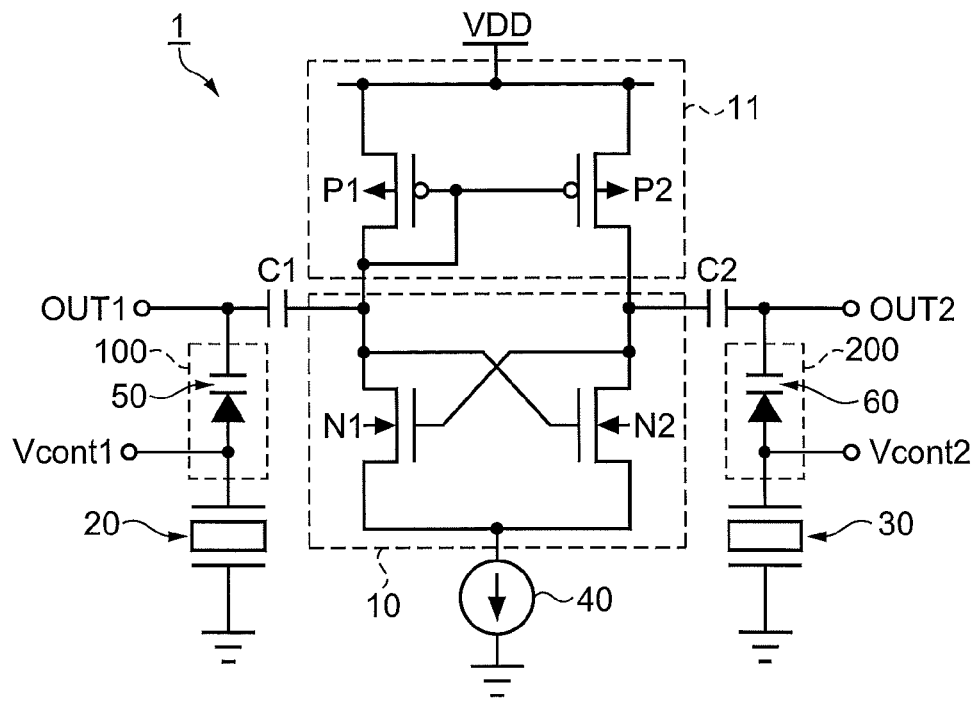
FIG. 5 is a circuit diagram showing the configuration of the surface acoustic wave oscillator according to a first modification.

FIG. 5 is a circuit diagram showing a configuration of the surface acoustic wave oscillator according to a first modification. The first modification is different from the above-mentioned embodiment of the invention (see FIG. 1) in that in the surface acoustic wave oscillator 1 a capacitor C1 is connected between the cross-coupled circuit 10 (between the transistor N1 and the transistor P1) and the output terminal OUT1 and a capacitor C2 is connected between the cross-coupled circuit 10 (between the transistor N2 and the transistor P2) and the output terminal OUT2.

Further, the SAW resonator 20 and the variable capacitance circuit 100 are connected in series in the stated order between the output terminal OUT1 and the ground potential line. The SAW resonator 30 and the variable capacitance circuit 200 are connected in series in the stated order between the output terminal OUT2 and the ground potential line. Even with such a structure, it is possible to obtain the same operational effects as the above-mentioned embodiment.

Second Modification

Figure 6:
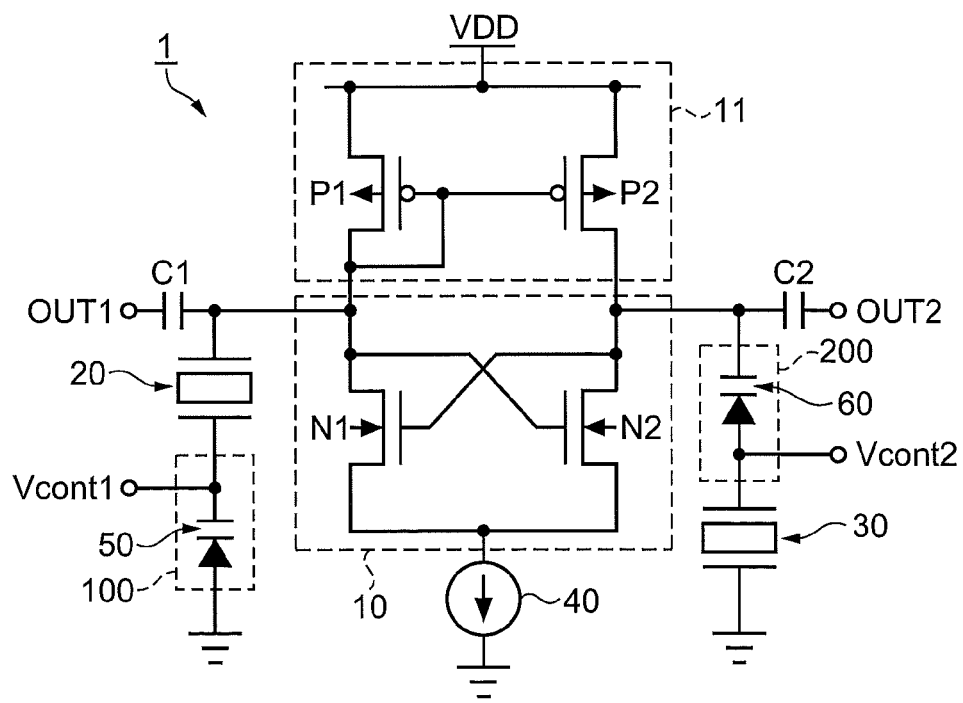
FIG. 6 is a circuit diagram showing the configuration of the surface acoustic wave oscillator according to a second modification.

FIG. 6 is a circuit diagram showing the configuration of the surface acoustic wave oscillator according to the second modification. According to the second modification, in the surface acoustic wave oscillator 1, a capacitor C1 is connected between the variable capacitance circuit 100 (variable capacitance diode 50) and the output terminal OUT1 and a capacitor C2 is connected between the variable capacitance circuit 200 (variable capacitance diode 60) and the output terminal OUT2.

Further, the capacitor C1, the SAW resonator 20 and the variable capacitance circuit 100 are connected in series in the stated order between the output terminal OUT1 and the ground potential line. On the other hand, the capacitor C2, the variable capacitance circuit 200 and the SAW resonator 30 are connected in series in the stated order between the output terminal OUT2 and the ground potential line. As shown in FIG. 6, even with the structure in which with respect to the cross-coupled circuit 10 the right and the left are asymmetrically configured, it is possible to obtain the same operational effects as the above-mentioned embodiment.

Note that only one of the capacitors C1 and C2 may be used.

Third Modification

Figure 7:
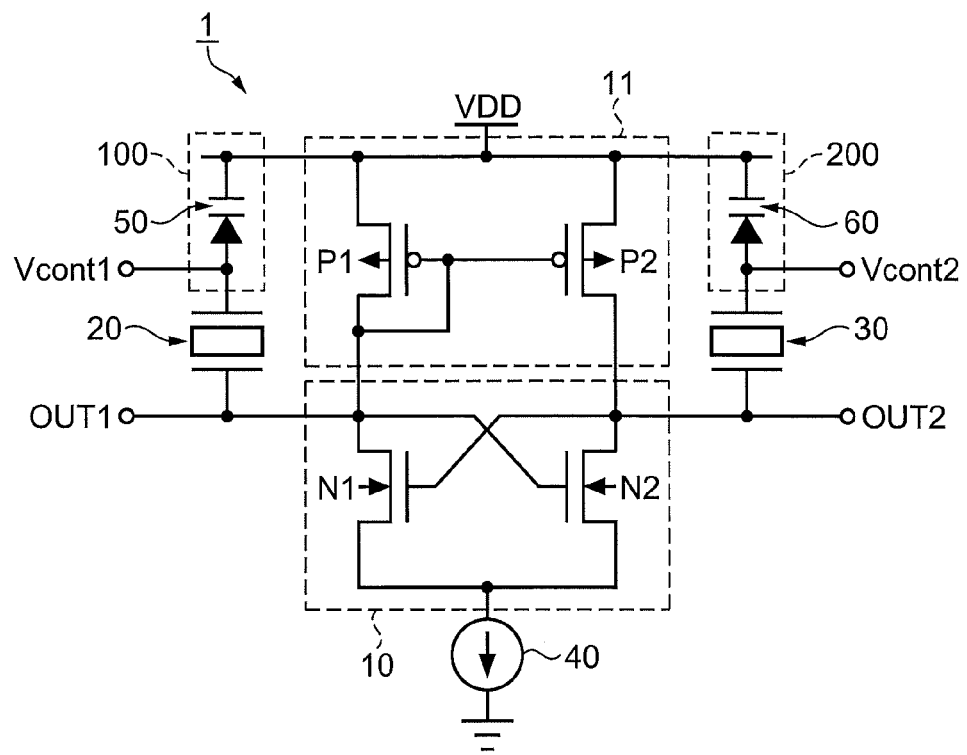
FIG. 7 is a circuit diagram showing the configuration of the surface acoustic wave oscillator according to a third modification.

FIG. 7 is a circuit diagram showing the configuration of the surface acoustic wave oscillator according to the third modification. The features of the third modification reside in that in the surface acoustic wave oscillator 1 the SAW resonator 20 and the variable capacitance circuit 100 are connected in series between the output terminal OUT1 and the VDD, and the SAW resonator 30 and the variable capacitance circuit 200 are connected in series between the output terminal OUT2 and the VDD. The configuration of the cross-coupled circuit 10 is similar to that of the above-mentioned embodiment (see FIG. 1).

Fourth Modification

Figure 8:
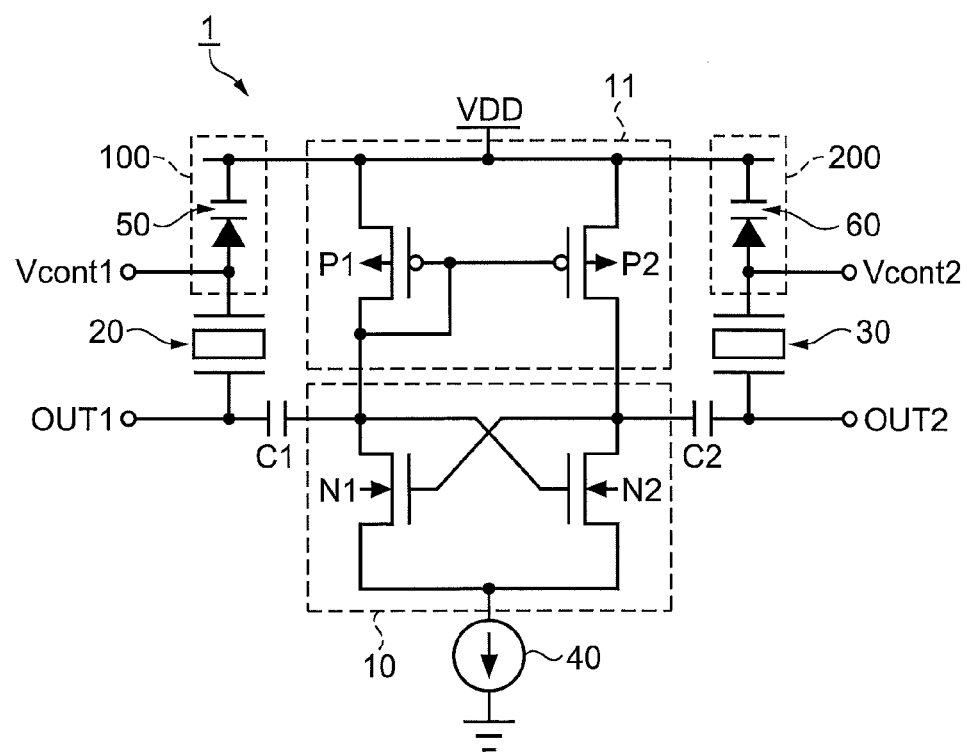
FIG. 8 is a circuit diagram showing the configuration of the surface acoustic wave oscillator according to a fourth modification.

FIG. 8 is a circuit diagram showing the configuration of the surface acoustic wave oscillator according to the fourth modification. The features of the fourth modification reside in that the capacitors C1, C2 are added to the above-mentioned third modification (see FIG. 7). As shown in FIG. 8, in the surface acoustic wave oscillator 1, the capacitor C1, the SAW resonator 20 and the variable capacitance circuit 100 are connected in series between the cross-coupled circuit 10 (between the transistor N1 and the transistor P1) and the VDD, and the capacitor C2, the SAW resonator 30 and the variable capacitance circuit 200 are connected in series between the cross-coupled circuit 10 (between the transistor N2 and the transistor P2) and the VDD.

Fifth Modification

Figure 9:
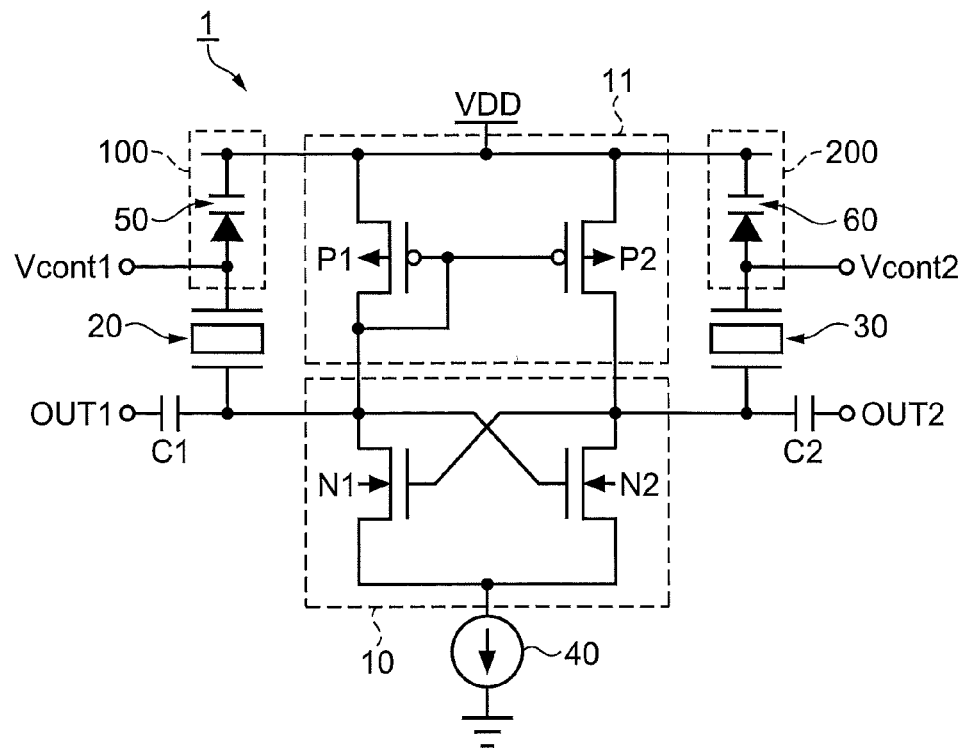
FIG. 9 is a circuit diagram showing the configuration of the surface acoustic wave oscillator according to a fifth modification.

FIG. 9 is a circuit diagram showing the configuration of the surface acoustic wave oscillator according to the fifth modification. According to the fifth modification, the arrangement portions of the capacitors C1, C2 added to the fourth modification described above (see FIG. 8) are changed. As shown in FIG. 9, in the surface acoustic wave oscillator 1, the capacitor C1 is connected between the SAW resonator 20 and the output terminal OUT1, and the capacitor C2 is connected between the SAW resonator 30 and the output terminal OUT2. In other words, the capacitor C1, the SAW resonator 20 and the variable capacitance circuit 100 are connected in series between the output terminal OUT1 and the VDD. On the other hand, the capacitor C2, the SAW resonator 30 and the variable capacitance circuit 200 are connected in series between the output terminal OUT2 and the VDD.

Sixth Modification

Figure 10:
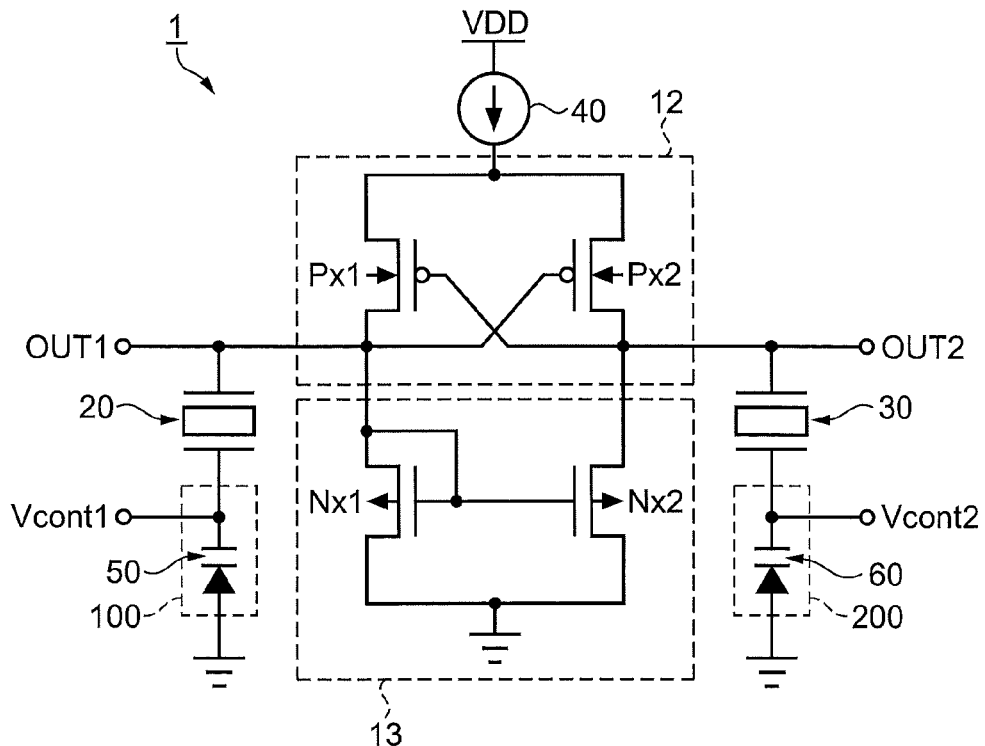
FIG. 10 is a circuit diagram showing the configuration of the surface acoustic wave oscillator according to a sixth modification.

FIG. 10 is a circuit diagram showing the configuration of the surface acoustic wave oscillator according to the sixth modification. The sixth modification is obtained by replacing the cross-coupled circuit 10 shown in FIG. 1 and FIG. 5 through FIG. 10 with a cross-coupled circuit 12, in which the first active element and the second active element are constituted by Pch transistors. The cross-coupled circuit 12 includes a Pch transistor Px1 (hereinafter merely referred to as transistor Px1) as the first active element differentially connected to the output terminal OUT1 and the output terminal OUT2, and a Pch transistor Px2 (hereinafter merely referred to as transistor Px2) as the second active element, and is connected to the current mirror circuit 13 having Nch transistors Nx1, Nx2 (hereinafter merely referred to as transistors Nx1, Nx2) and to the constant current source 40. In the transistor Nx1, a source terminal is connected to the ground potential line, and a gate terminal and a drain terminal are connected to the output terminal OUT1.

In the transistor Nx2, a source terminal is connected to the ground potential line, a gate terminal is connected to the output terminal OUT1, and a drain terminal is connected to the output terminal OUT2. In the transistor Px1, a source terminal is connected to the VDD via the constant current source 40, a gate terminal is connected to the output terminal OUT2, and a drain terminal is connected to the output terminal OUT1. In the transistor Px2, a source terminal is connected to the VDD via the constant current source 40, a gate terminal is connected to the output terminal OUT1, and a drain terminal is connected to the output terminal OUT2.

According to the sixth modification, the variable capacitance diodes 50, 60 used are MOS type diodes.

Seventh Modification

Figure 11:
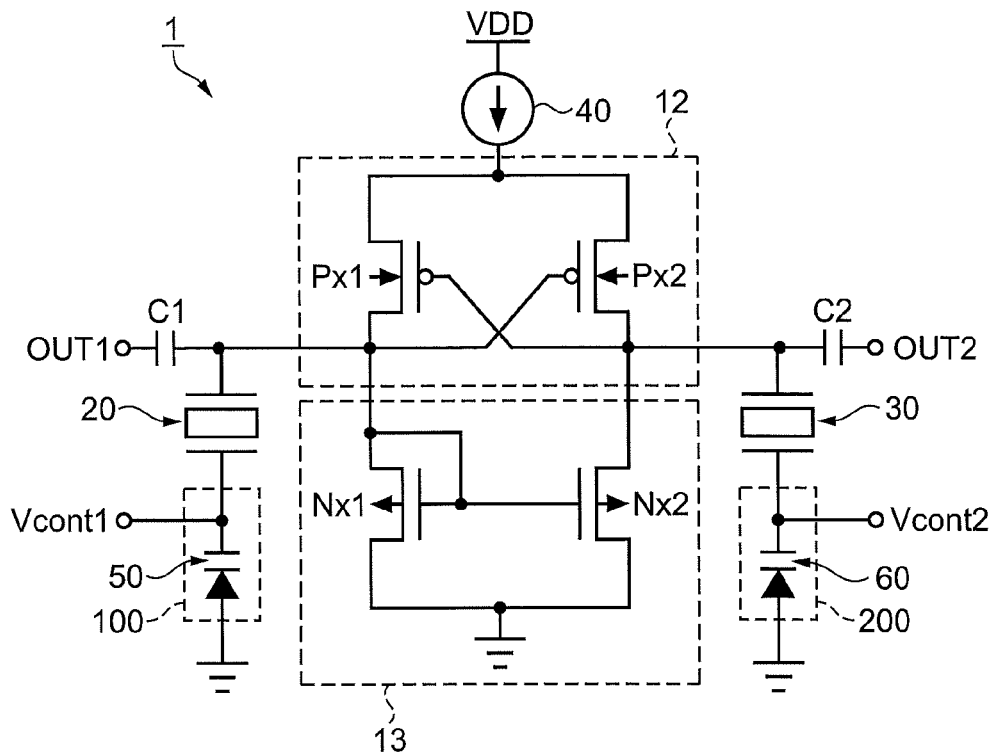
FIG. 11 is a circuit diagram showing the configuration of the surface acoustic wave oscillator according to a seventh modification.

FIG. 11 is a circuit diagram showing the configuration of the surface acoustic wave oscillator according to the seventh modification. The features of the seventh modification reside in that the capacitors C1, C2 are added to the above-mentioned sixth modification (see FIG. 10). As shown in FIG. 11, in the surface acoustic wave oscillator 1, the capacitor C1, the SAW resonator 20, and the variable capacitance circuit 100 are connected in series between the output terminal OUT1 and the ground potential line, and the capacitor C2, the SAW resonator 30, and the variable capacitance circuit 200 are connected in series between the output terminal OUT2 and the ground potential line.

Eighth Modification

Figure 12:
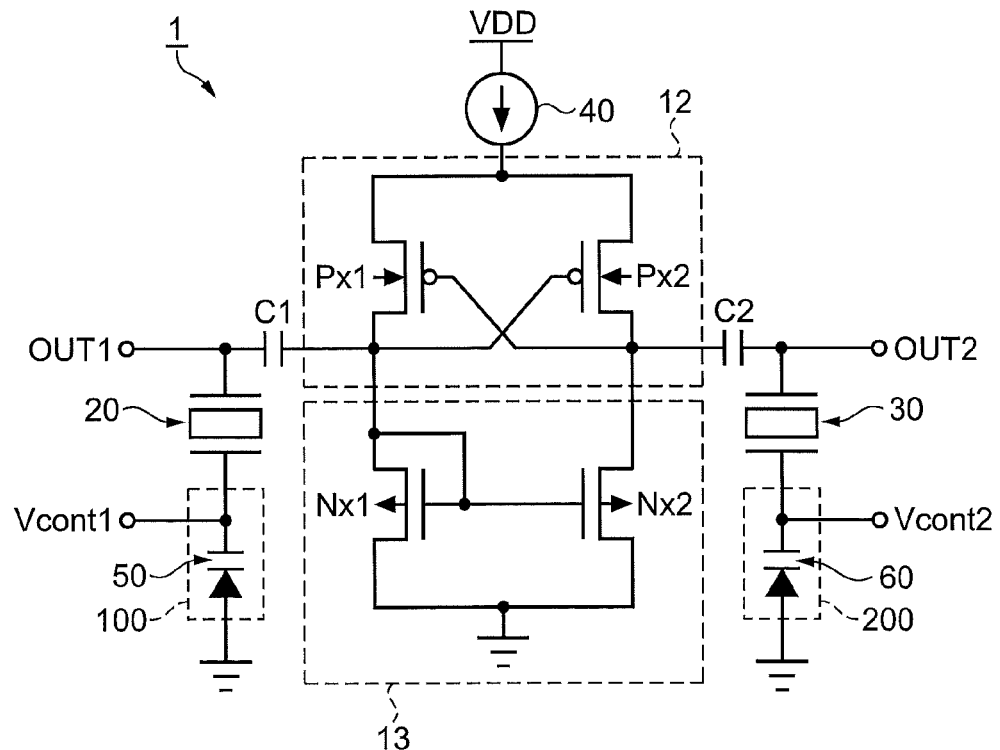
FIG. 12 is a circuit diagram showing the configuration of the surface acoustic wave oscillator according to a eighth modification.

FIG. 12 is a circuit diagram showing the configuration of the surface acoustic wave oscillator according to the eighth modification. The features of the eighth modification reside in that the positional arrangements of the capacitors C1, C2 added to the above-mentioned seventh modification (see FIG. 11) are changed. As shown in FIG. 12, in the surface acoustic wave oscillator 1, the capacitor C1, the SAW resonator 20, and the variable capacitance circuit 100 are connected in series between the cross-coupled circuit 12 (between the transistor Px1 and the transistor Nx1) and the ground potential line, and the capacitor C2, the SAW resonator 30 and the variable capacitance circuit 200 are connected in series between the cross-coupled circuit 12 (between the transistor Px2 and the transistor Nx2) and the ground potential line.

Ninth Modification

Figure 13:
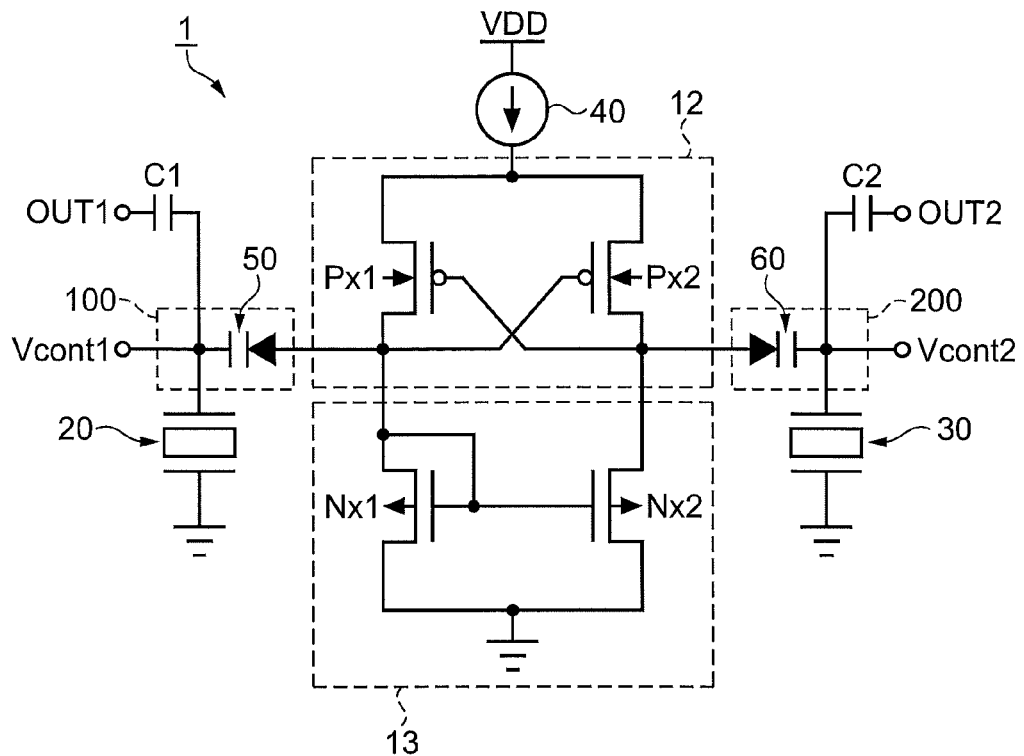
FIG. 13 is a circuit diagram showing the configuration of the surface acoustic wave oscillator according to a ninth modification.

FIG. 13 is a circuit diagram showing the configuration of the surface acoustic wave oscillator according to the ninth modification. The features of the ninth modification reside in that the capacitors C1, C2 are added to the above-mentioned sixth modification (see FIG. 10) and the arrangements of the variable capacitance circuits 100, 200 are changed. As shown in FIG. 13, in the surface acoustic wave oscillator 1, the variable capacitance circuit 100 and the SAW resonator 20 are connected in series between the cross-coupled circuit 12 (between the transistor Nx1 and the transistor Px1) and the ground potential line, and the SAW resonator 20 and the capacitor C1 are connected in series between the ground potential line and the output terminal OUT1.

On the other hand, the variable capacitance circuit 200 and the SAW resonator 30 are connected in series between the cross-coupled circuit 12 (between the transistor Nx2 and the transistor Px2) and the ground potential line, and the SAW resonator 30 and the capacitor C2 are connected in series between the ground potential line and the output terminal OUT2.

Tenth Modification

Figure 14:
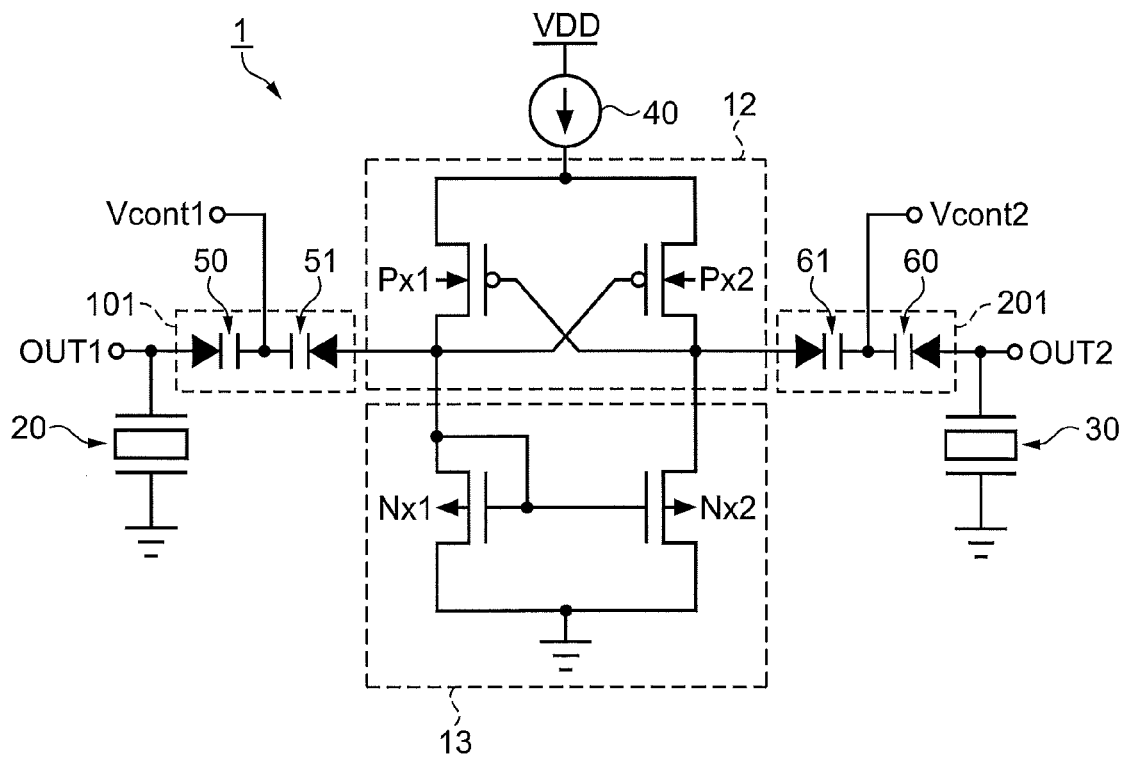
FIG. 14 is a circuit diagram showing the configuration of the surface acoustic wave oscillator according to a tenth modification.

FIG. 14 is a circuit diagram showing the configuration of the surface acoustic wave oscillator according to the tenth modification. The features of the tenth modification reside in that two variable capacitance diodes are respectively added to the variable capacitance circuits 100, 200 according to the above-described ninth modification (see FIG. 13). Note that the capacitors C1, C2 are not used here. As shown in FIG. 14, in the surface acoustic oscillator 1, the variable capacitance circuit 101 (variable capacitance diodes 51, 50) and the SAW resonator 20 are connected in series between the cross-coupled circuit 12 (between the transistor Nx1 and the transistor Px1) and the ground potential line, and the control terminal Vcont1 is connected between the variable capacitance diodes 50 and 51. Further, the variable capacitance diodes 50, 51 are connected in series between the output terminal OUT1 and the cross-coupled circuit 12.

On the other hand, the variable capacitance circuit 201 (variable capacitance diodes 61, 60) and the SAW resonator 30 are connected in series between the cross-coupled circuit 12 (between the transistor Nx2 and the transistor Px2) and the ground potential line, the control terminal Vcont2 is connected between the variable capacitance diodes 61 and 60. Further, the variable capacitance diodes 60, 61 are connected in series between the output terminal OUT2 and the cross-coupled circuit 12.

Even with the construction according to the first modification through the tenth modification (see FIG. 5 through FIG. 14), the surface acoustic wave oscillator 1 can show the same operational effects as the above-mentioned embodiment of the invention (see FIG. 1 through FIG. 4).

Note that although PMOS type variable capacitance diodes are used in the configurations of FIG. 10 through FIG. 14 this should not be construed restrictively. Further, although not shown, in the circuit configurations according to FIG. 7 through FIG. 9 NMOS type variable capacitance diodes are used. However, PMOS type variable capacitance diodes may be used instead of using NMOS type variable capacitance diodes.

Eleventh Modification

Next, the eleventh modification will be described with reference to the drawings. The features of the eleventh modification reside in that the SAW resonator and the variable capacitance circuit are connected in series in the above-mentioned embodiment of the invention and the first through tenth modifications but are connected in parallel in the eleventh modification. Note that the case in which NMOS type variable capacitance diodes are used will be described as an example.

Figure 15:
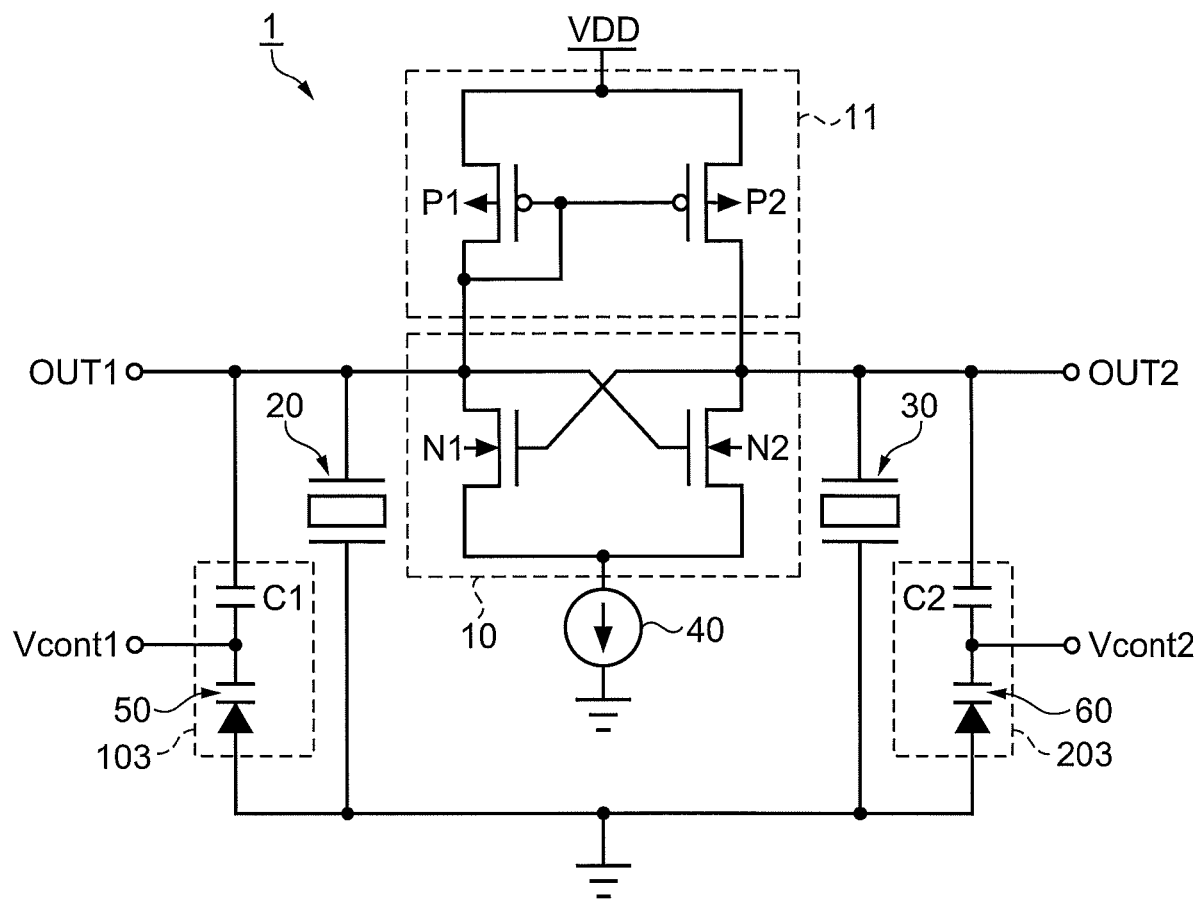
FIG. 15 is a circuit diagram showing the configuration of the surface acoustic wave oscillator according to an eleventh modification.

FIG. 15 is a circuit diagram showing the configuration of the surface acoustic wave oscillator according to the eleventh modification. As shown in FIG. 15, the surface acoustic wave oscillator 1 includes the cross-coupled circuit 10 having the output terminal OUT1 and the output terminal OUT2, the SAW resonator 20, the SAW resonator 30, the variable capacitance circuit 103 connected to the control terminal Vcont1, and the variable capacitance circuit 203 connected to the control terminal Vcont2.

The variable capacitance circuit 103 includes the variable capacitance diode 50 and the capacitor C1. In the variable capacitance diode 50, a cathode terminal is connected to the control terminal Vcont1 and an anode terminal is connected to the ground potential line. One terminal of the capacitor C1 is connected to the control terminal Vcont1 (with the variable capacitance diode 50) and the other of the capacitor C1 is connected to the output terminal OUT1.

The variable capacitance circuit 203 includes the variable capacitance diode 60 and the capacitor C2. In the variable capacitance diode 60, a cathode terminal is connected to the control terminal Vcont2 and an anode terminal is connected to the ground potential line. One terminal of the capacitor C2 is connected to the control terminal Vcont2 (with the variable capacitance diode 60) and the other of the capacitor C2 is connected to the output terminal OUT2.

Further, one terminal of the SAW resonator 20 is connected to the output terminal OUT1 and the other of the SAW resonator 20 is connected to the ground potential line.

One terminal of the SAW resonator 30 is connected to the output terminal OUT2 and the other of the SAW resonator 30 is connected to the ground potential line.

Therefore, as shown in FIG. 15, the surface acoustic wave oscillator 1 is configured such that the cross-coupled circuit 10, the variable capacitance circuit 103 and the SAW resonator 20 are connected in parallel and the cross-coupled circuit 10, the variable capacitance circuit 203 and the SAW resonator 30 are connected in parallel.

Next, the operation of the surface acoustic wave oscillator according to the eleventh modification will be described with reference to the drawings.

Figure 16:
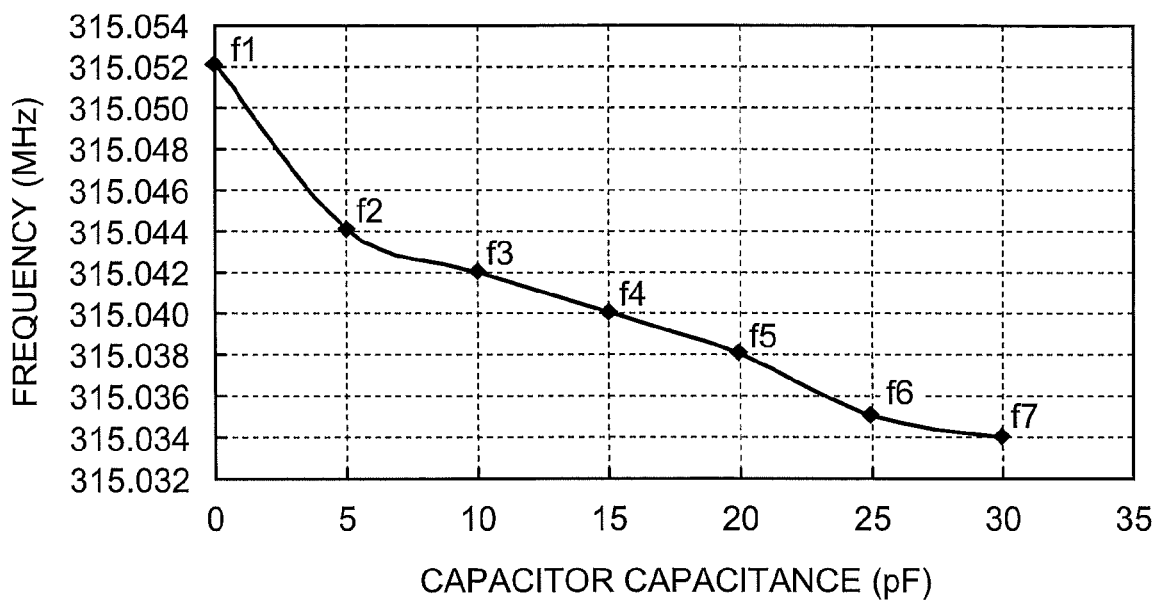
FIG. 16 is a graph showing the relationship between the capacitor capacitance and the frequency according to the eleventh modification.

FIG. 16 is a graph illustrating the relationship between the capacitor capacitance and the frequency in the case of the eleventh modification.

FIG. 16 shows the change of the frequencies of the SAW resonators 20, 30 at the time when the voltages applied to the control terminal Vcont1 and the control terminal Vcont2 are changed and in accordance with the size of those voltage values the capacitor capacitances of the variable capacitance diodes 50, 60 are changed. As shown in FIG. 16, frequency changes in accordance with capacitor capacitance. To be more specific, in the vicinity of 0 pF, the frequency f1=315.052 MHz is outputted and in the vicinity of 30 pF, the frequency f7=315.034 MHz is outputted. The frequency (represented by f2 through f6 in the figure) changes therebetween while showing a nonlinear continuousness. Therefore, by changing the voltage values of the first control voltage and the second control voltage respectively, it becomes possible to change the capacitor capacitance of the variable capacitance diodes 50, 60 so they are adjusted to the desired output frequencies of the SAW resonators 20, 30, respectively.

Figure 17:
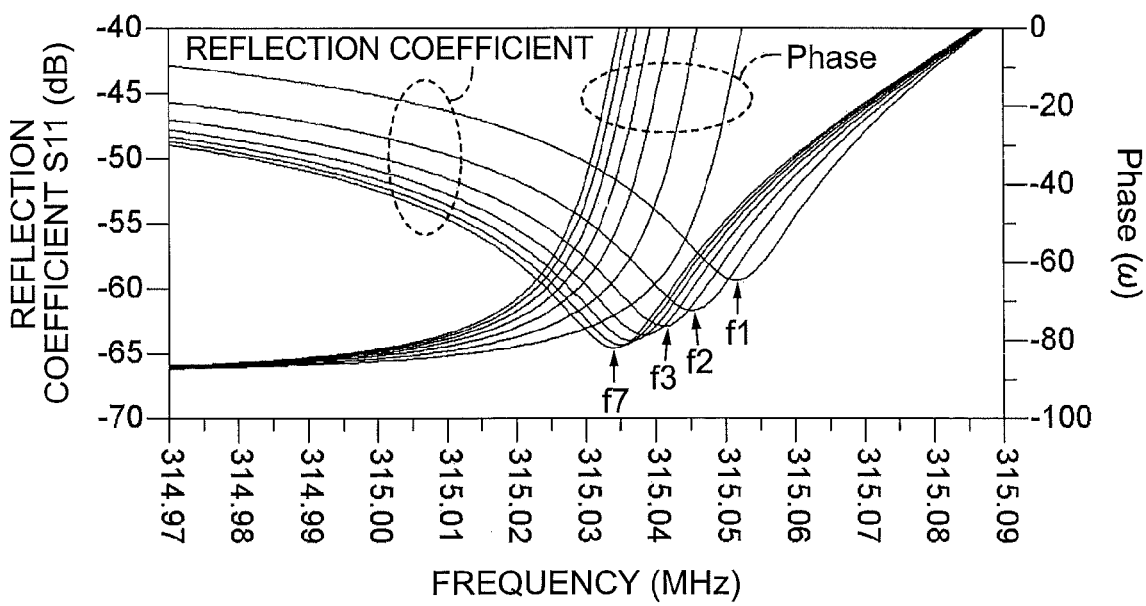
FIG. 17 is a graph showing the operation of the surface acoustic wave oscillator according to the eleventh modification.

FIG. 17 is a graph illustrating the operation of the surface acoustic wave oscillator according to the eleventh modification. The graph of FIG. 17 illustrates a case in which the same voltage is applied to the first control terminal Vcont1 and the second control terminal Vcont2 of the surface acoustic wave oscillator 1 (that is to say, the first control voltage is equal to the second control voltage) while being changed. A plurality of graphs of the reflection coefficient S11 and the phase characteristics (Phase) shown respectively illustrate the case in which the first control voltage is changed and the case in which the second control voltage is changed. As shown in FIG. 17, in the graph of the reflection coefficient (S11), gain can be obtained in the wide range between 314.97 MHz and 315.09 MHz.

The output frequency corresponds to the intersection point of the lowest point of the reflection coefficient S11 at the time when the phase characteristics ω is zero. As a result, the frequencies f1 through f7 are obtained (Note that the frequencies f1, f5 and f6 are not shown for the sake of clarity.) The frequencies f1 through f7 here respectively correspond to the frequencies f1 through f7 shown in FIG. 16. Therefore, it is possible to make the output frequency continuously change between the frequencies f1 through f7.

Even in the structure such as the above-mentioned eleventh modification in which the SAW resonator and the variable capacitance circuit are connected in parallel, the output frequency can be made to change while showing continuousness and achieve a wider bandwidth although as compared to the case of the series connection the frequency sensitivity against the change of the capacitor capacitance is somewhat lower.

Note that with reference to the eleventh modification the case in which the same voltage is applied to the control terminal Vcont1 and the control terminal Vcont2. However, by controlling these control terminals by using different voltages, it becomes possible to set further differentiated frequency and wider bandwidth.

Twelfth Modification

Next, the surface acoustic wave oscillator according to the twelfth modification will be described with reference to the drawings. The features of the twelfth modification reside in that as compared with the above-mentioned eleventh modification (see FIG. 15) two variable capacitance diodes are respectively added to the variable capacitance circuits and the capacitors C1, C2 are omitted.

Figure 18:
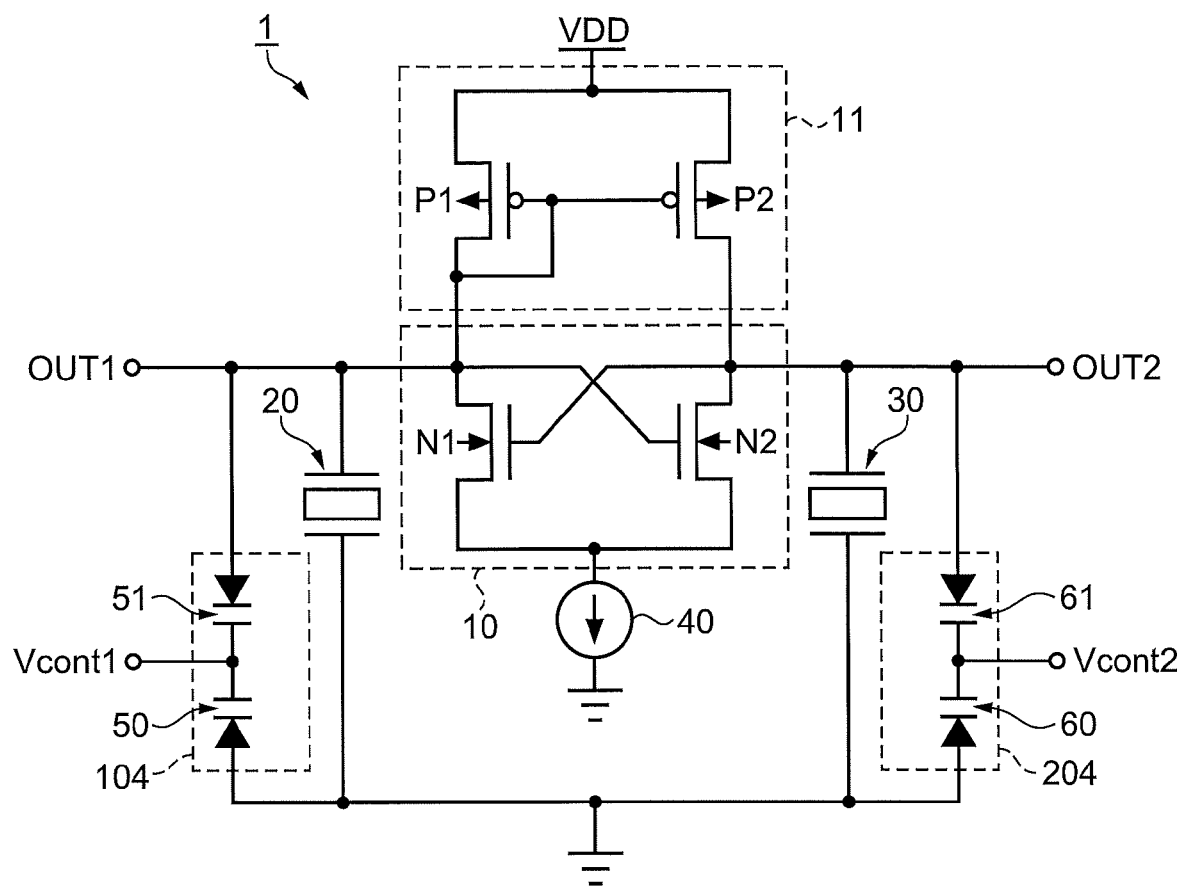
FIG. 18 is a circuit diagram showing the configuration of the surface acoustic wave oscillator according to a twelfth modification.

FIG. 18 is a circuit diagram showing the configuration of the surface acoustic wave oscillator according to the twelfth modification. As shown in FIG. 18, in the surface acoustic wave oscillator 1, the cross coupled circuit 10, the variable capacitance circuit 104 and the SAW resonator 20 are connected in parallel and the cross-coupled circuit 10, the variable capacitance circuit 204 and the SAW resonator 30 are connected in parallel.

In the variable capacitance circuit 104, the variable capacitance diodes 51, 50 are connected in series between the output terminal OUT1 and the ground potential line and the control terminal Vcont1 is connected between the variable capacitance diode 51 and the variable capacitance diode 50.

On the other hand, in the variable capacitance circuit 204, the variable capacitance diodes 61, 60 are connected in series between the output terminal OUT2 and the ground potential line, and the control terminal Vcont2 is connected between the variable capacitance diode 61 and the variable capacitance diode 60.

With the configuration according to the twelfth modification, the same effect as the above-mentioned eleventh modification can be obtained.

Note that NMOS type variable capacitance diodes have been described as an example in the eleventh modification and the twelfth modification. However, it is also possible to use PMOS type variable capacitance diodes.

What is claimed is:

1. A surface acoustic wave oscillator comprising:
   a cross-coupled circuit including a first active element and a second active element differentially connected to a first output terminal and a second output terminal;
   a first surface acoustic wave element and a second surface acoustic wave element having different resonance frequencies and connected to the cross-coupled circuit in parallel;
   a first variable capacitance circuit including a first variable capacitance element and changing the resonance frequency of the first surface acoustic wave element, the first variable capacitance element changing capacitance value in accordance with a first control voltage applied from a first control terminal; and
   a second variable capacitance circuit including a second variable capacitance element and changing the resonance frequency of the second surface acoustic wave element, the second variable capacitance element changing capacitance value in accordance with a second control voltage applied from a second control terminal, wherein:
   the first surface acoustic wave element and the first variable capacitance circuit are connected and the second surface acoustic wave element and the second variable capacitance circuit are connected;
   outputs of the first surface acoustic wave element and the second surface acoustic wave element having the different resonance frequencies are combined; and
   oscillating outputs obtained by combining the outputs of the first surface acoustic wave element and the second surface acoustic wave element are outputted by the cross-coupled circuit.

2. The surface acoustic wave oscillator according to claim 1, wherein
   the first surface acoustic wave element and the second surface acoustic wave element are stacked on a semiconductor chip including the cross-coupled circuit, the first variable capacitance circuit and the second variable capacitance circuit.

3. A method of varying a frequency for a surface acoustic wave oscillator having: a cross-coupled circuit including a first active element and a second active element differentially connected to a first output terminal and a second output terminal; a first surface acoustic wave element and a second surface acoustic wave element having different resonance frequencies and connected to the cross-coupled circuit in parallel; a first variable capacitance circuit including a first variable capacitance element and changing the resonance frequency of the first surface acoustic wave element, the first variable capacitance element changing capacitance value in accordance with a first control voltage applied from a first control terminal; and a second variable capacitance circuit including a second variable capacitance element and changing the resonance frequency of the second surface acoustic wave element, the second variable capacitance element changing capacitance value in accordance with a second control voltage applied from a second control terminal, wherein: the first surface acoustic wave element and the first variable capacitance circuit are connected and the second surface acoustic wave element and the second variable capacitance circuit are connected; and oscillating outputs obtained by combining the outputs of the first surface acoustic wave element and the second surface acoustic wave element are outputted by the cross-coupled circuit, the method comprising:

combining the outputs of the first surface acoustic wave element and the second surface acoustic wave element having the different resonance frequencies; and changing oscillating frequencies of the first surface acoustic wave element and the second surface acoustic wave element by changing voltage values of the first control voltage and the second control voltage.

* * * * *